(12) United States Patent
Fujikawa et al.

(10) Patent No.: US 7,679,929 B2
(45) Date of Patent: Mar. 16, 2010

(54) WIRING BOARD AND WIRING BOARD MODULE

(75) Inventors: Katsuhiko Fujikawa, Yasu (JP); Koji Tanaka, Echizen (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 45 days.

(21) Appl. No.: 11/687,319

(22) Filed: Mar. 16, 2007

(65) Prior Publication Data

US 2007/0151757 A1    Jul. 5, 2007

Related U.S. Application Data

(63) Continuation of application No. PCT/JP2004/016259, filed on Nov. 2, 2004.

(30) Foreign Application Priority Data

Sep. 22, 2004    (JP)    ............................. 2004-275881

(51) Int. Cl.
    *H01R 9/00*    (2006.01)
(52) U.S. Cl. ...................... 361/774; 174/260
(58) Field of Classification Search ............... 361/774, 361/777–779; 174/260
    See application file for complete search history.

(56) References Cited

U.S. PATENT DOCUMENTS

| | | | | |
|---|---|---|---|---|
| 5,268,536 A | * | 12/1993 | Kakehi | .................. 174/259 |
| 6,059,382 A | * | 5/2000 | Schoettl | .................. 303/119.3 |
| 6,217,990 B1 | | 4/2001 | Asai et al. | |
| 6,429,114 B1 | * | 8/2002 | Hayama et al. | ............. 438/616 |
| 6,730,860 B2 | * | 5/2004 | Searls et al. | ................ 174/262 |
| 6,803,664 B2 | * | 10/2004 | Murayama | .................. 257/779 |
| 6,835,597 B2 | | 12/2004 | Murayama | |
| 2002/0049042 A1 | | 9/2002 | Oida et al. | |
| 2002/0125043 A1 | | 9/2002 | Yoshida | |

FOREIGN PATENT DOCUMENTS

| | | |
|---|---|---|
| EP | 1255300 A2 | 11/2002 |
| JP | 1-112076 U | 7/1989 |
| JP | 01-187894 A | 7/1989 |
| JP | 03-077394 A | 4/1991 |
| JP | 3-61373 U | 6/1991 |

(Continued)

OTHER PUBLICATIONS

Official Communication for PCT Application No. PCT/JP2004/016259; mailed on Dec. 14, 2004.

(Continued)

*Primary Examiner*—Jeremy C Norris
(74) *Attorney, Agent, or Firm*—Keating & Bennett, LLP

(57) ABSTRACT

A wiring board module includes a multilayer wiring board. A crystal oscillator and an IC component, for example, are mounted on the mounting surface of the multilayer wiring board. Mounting lands for the IC component, mounting lands for the crystal oscillator, and mounting lands for other surface mount components are provided on the mounting surface. Each mounting land for the crystal oscillator is not a conventional single large-area land but is defined by four adjacent land pieces. The four land pieces are electrically connected via an external terminal of the crystal oscillator, thereby functioning as a mounting land for the external terminal. In other words, each of the plurality of mounting lands provided at locations corresponding to external terminals of the crystal oscillator is divided into four land pieces.

26 Claims, 4 Drawing Sheets

FOREIGN PATENT DOCUMENTS

| | | |
|---|---|---|
| JP | 06-260746 A | 9/1994 |
| JP | 09-307022 A | 11/1997 |
| JP | 10-075042 A | 3/1998 |
| JP | 2002-009225 A | 1/2002 |
| JP | 2003-060334 A | 2/2003 |
| JP | 2004-172260 A | 6/2004 |

OTHER PUBLICATIONS

Official Communication issued in the counter part Japanese Application No. JP2005-518384, mailed on Jul. 12, 2006.

Official communication issued in counterpart Korean Application No. 10-2007-7005187, dispatched on Feb. 25, 2008.

Official communication issued in the counterpart European Application No. 04799462.9, mailed on Sep. 11, 2007.

Official communication issued in counterpart European Application No. 04 799 462.9, mailed on Oct. 28, 2008.

Official communication issued in counterpart Chinese Application No. 200480044028, mailed on Feb. 20, 2009.

\* cited by examiner

WIRING BOARD AND WIRING BOARD MODULE

BACKGROUND OF THE INVENTION

1. Field of the Invention

The present invention relates to a wiring board, and more specifically, to a wiring board on which electronic components, such as an IC, are to be mounted, and to a wiring board module.

2. Description of the Related Art

A high-frequency module in which various components, such as an IC component, a crystal oscillator, and other surface mount components, are mounted on the mounting surface of a ceramic wiring board is known (see, for example, Japanese Unexamined Patent Application Publication No. 2002-9225 (Patent Document 1)). Various mounting lands are provided on the mounting surface of this wiring board. Normally, one mounting land is provided for each external terminal of the mounted components. Generally, the sizes of these mounting lands are selected according to the sizes of external terminals of the mounted components. The reason is that mounting a large-size component requires a large amount of solder, and therefore, requires large-area lands.

FIG. 8 is a plan view showing an example of a conventional ceramic wiring board module 50. A crystal oscillator 1 and an IC component 2 are mounted on the mounting surface 51a of a wiring board 51, which are shown by an alternate long and short dash line, and other surface mount components (not shown). Mounting lands 52 for the IC component 2, mounting lands 53 for the crystal oscillator 1, and mounting lands 54 for other surface mount components are provided on the mounting surface 51a. The area of the mounting lands 53 is substantially larger than the other mounting lands 52 and 54.

However, when the large-area mounting lands 53 are provided, large local swells (protrusions) are generated at the locations of the mounting lands 53 on the mounting surface 51a of the wiring board 51. This is due to the difference in shrinkage factor between the wiring board body and the mounting lands upon firing. In general, when fired, a board body made of ceramic substantially shrinks, while mounting lands do not substantially shrink. Therefore, when large-area mounting lands are provided, the mounting surface of the wiring board swells.

FIG. 9 is a graph showing the amount of swell in the X direction in the conventional wiring board 51 measured throughout the wiring board 51 at predetermined pitch intervals. FIG. 10 is a graph showing the amount of swell in the Y direction in the conventional wiring board 51 measured throughout the wiring board 51 at predetermined pitch intervals. In FIGS. 9 and 10, the vertical axis indicates the amount of swell (μm), and the horizontal axis indicates the locations of measuring points.

In the circles P1 and P2 in FIG. 9, large local swells caused by the mounting lands 53 are regenerated. These swells prevent small-size electronic components from being mounted in a desired location place and/or prevent electronic components from being mounted horizontally.

SUMMARY OF THE INVENTION

To overcome the problems described above, preferred embodiments of the present invention provide a wiring board and a wiring board module in which the swell of the board body is significantly reduced and minimized.

In a first preferred embodiment of the present invention, a wiring board includes a board body on which components are to be mounted, and a plurality of mounting lands provided on the board body. At least one of the mounting lands includes a plurality of adjacent land pieces that are to be electrically connected via a terminal of one of the components to be mounted and that are to thereby function as a mounting land for the terminal.

In a second preferred embodiment of the present invention, a wiring board includes a board body on which components are to be mounted, and a plurality of mounting lands provided on the board body and at locations corresponding to terminals of the components to be mounted. At least one of the mounting lands is divided into a plurality of land pieces.

The board body has a single ceramic board structure or a multilayer structure in which a plurality of ceramic layers and a plurality of internal electrodes are laminated.

In the first and second preferred embodiments of the present invention, a relatively large-area mounting land is defined by relatively small-area land pieces. Therefore, the difference in shrinkage factor between the wiring board and the mounting lands during firing is less locally concentrated. On the other hand, since relatively small-area land pieces define a substantially large-area land, a sufficient amount of solder can be provided even for large-size mounted components.

In the first and second preferred embodiments of the present invention, at least one of the plurality of land pieces that are to be electrically connected via a terminal of one of the components to be mounted preferably has an area that is not more than half of the projected area of the terminal on the mounting surface of the board body. In this case, the area of the land pieces is not unnecessarily large and is set to an appropriate area.

The area ratio A/a between the largest area A and the smallest area a of the areas of the land pieces and the areas of the mounting lands, except for the mounting lands defined by the plurality of land pieces, is preferably about 3 or less. In this case, the amount of the swell (the amount of the protrusion) on the mounting surface caused by the difference in shrinkage factor between the board body and the mounting lands is evenly distributed, and the difference in height between the mounting lands is minimized.

A swell correcting pattern may be provided in a region on the surface of the board body where no mounting lands are provided. By intentionally generating swells (protrusions) with the swell correcting pattern so that the amount of swell is the same as that in the region where the mounting lands are provided, the flatness of the mounting surface is improved.

In a third preferred embodiment of the present invention, a wiring board module includes a wiring board having the above-described characteristics, and a component mounted on the wiring board so that a terminal of the component electrically connects the plurality of land pieces.

In preferred embodiments of the present invention, a relatively large-area mounting land is defined by relatively small-area land pieces. Therefore, the difference in shrinkage factor between the wiring board and the mounting lands during firing is less locally concentrated. Thus, the large local swells generated on the mounting surface of the wiring board are reduced. On the other hand, since relatively small-area land pieces define a substantially large-area land, a sufficient amount of solder can be provided even to a large-size mounted component.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Preferred embodiments of the wiring board and the wiring board module according to the present invention will now be described with reference to the drawings.

First Preferred Embodiment

Figure 1:
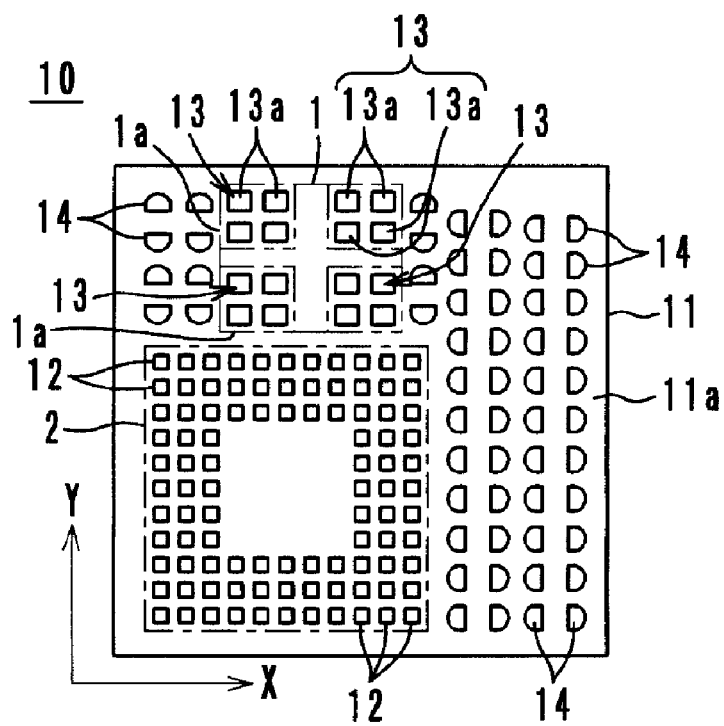
FIG. 1 is a plan view showing a first preferred embodiment of the wiring board and the wiring board module according to the present invention.

As shown in FIG. 1, a wiring board module 10 includes a multilayer wiring board 11. A crystal oscillator 1 and an IC component 2, which are shown by an alternate long and short dash line, and other surface mount components (not shown) are mounted on the mounting surface 11a of the multilayer wiring board 11. Mounting lands 12 for the IC component 2, mounting lands 13 for the crystal oscillator 1, and mounting lands 14 for other surface mount components are provided on the mounting surface 11a.

Figure 8:
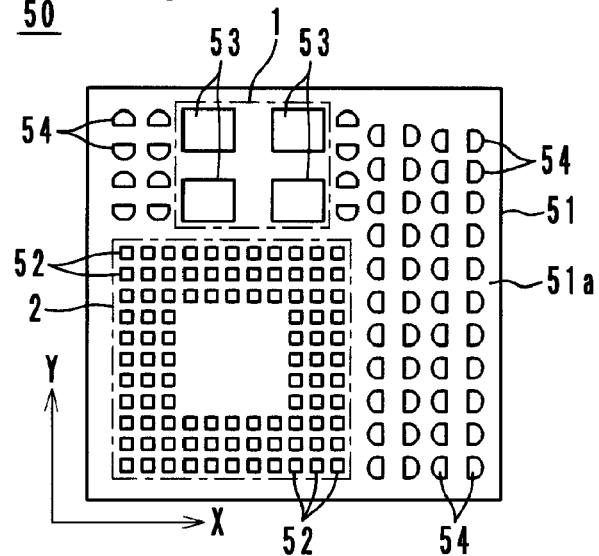
FIG. 8 is a plan view showing a conventional wiring board and a conventional wiring board module.

Each mounting land 13 for the crystal oscillator 1 is not a conventional single large-area land, as shown in FIG. 8, but is defined by four adjacent land pieces 13a. The four land pieces 13a are electrically connected via an external terminal 1a of the crystal oscillator 1, thereby functioning as a mounting land for the external terminal 1a. In other words, each of the plurality of mounting lands 13 provided at locations corresponding to external terminals 1a of the crystal oscillator 1 is divided into four land pieces 13a.

The multilayer wiring board 11 is made by stacking, press-bonding, and then co-firing a ceramic green sheet on which mounting lands 12 to 14 are provided, a ceramic green sheet on which internal electrodes are provided, and other suitable components. The mounting lands 12 to 14 and the internal electrodes are made, for example, of silver, palladium, copper, gold, and their alloys by screen printing.

Figure 2:
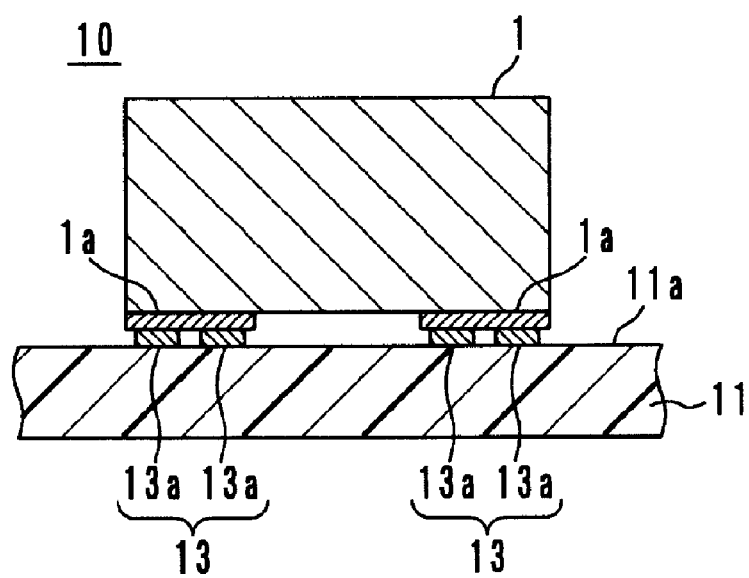
FIG. 2 is a sectional view illustrating a mounting state of the wiring board module shown in FIG. 1.

The crystal oscillator 1, the IC component 2, and other surface mount components are soldered onto the surface of this multilayer wiring board 11. As shown in FIG. 2, each external terminal 1a of the crystal oscillator 1 is soldered to the four land pieces 13a of the corresponding mounting land 13. Therefore, the four land pieces 13a are electrically connected to each other by the external terminal 1a of the crystal oscillator 1.

Since the relatively large-area mounting land 13 is defined by the relatively small-area land pieces 13a, the difference in shrinkage factor between the multilayer wiring board 11 and the mounting lands 13 during firing is less locally concentrated. Thus, the large local swells (primarily protrusions) generated on the mounting surface 11a of the multilayer wiring board 11 are reduced. Consequently, the defective mounting of the components 1 and 2 is reduced. On the other hand, since relatively small-area land pieces 13a define a substantially large-area land 13, a sufficient amount of solder can be provided even for the large-size crystal oscillator 1.

Figure 3:
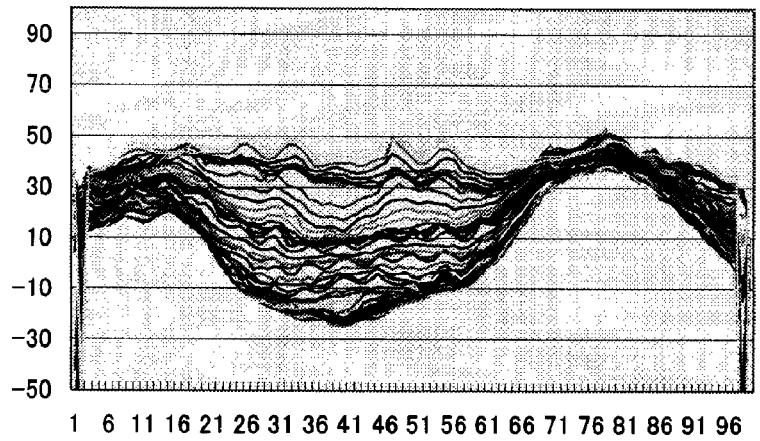
FIG. 3 is a graph showing the amount of swell in the X direction in the wiring board shown in FIG. 1.
Figure 4:
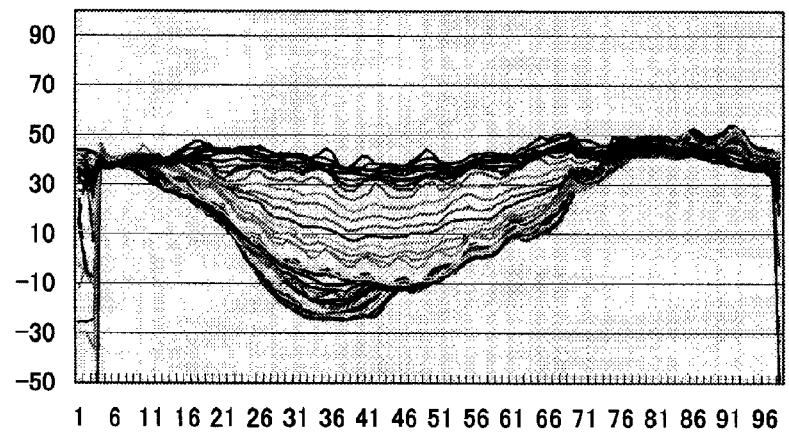
FIG. 4 is a graph showing the amount of swell in the Y direction in the wiring board shown in FIG. 1.

FIG. 3 is a graph showing the amount of swell in the X direction in the multilayer wiring board 11 shown in FIG. 1, measured throughout the multilayer wiring board 11 at predetermined pitch intervals. FIG. 4 is a graph showing the amount of swell in the Y direction in the multilayer wiring board 11, measured throughout the multilayer wiring board 11 at predetermined pitch intervals. In FIGS. 3 and 4, the vertical axis indicates the amount of swell (μm), and the horizontal axis indicates the positions of measuring points.

Figure 9:
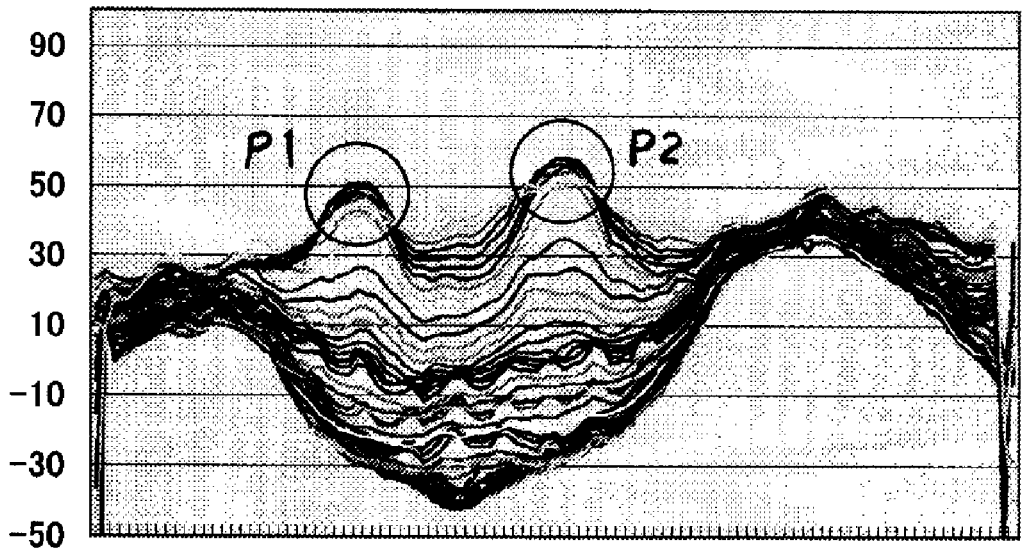
FIG. 9 is a graph showing the amount of swell in the X direction in the wiring board shown in FIG. 8.
Figure 10:
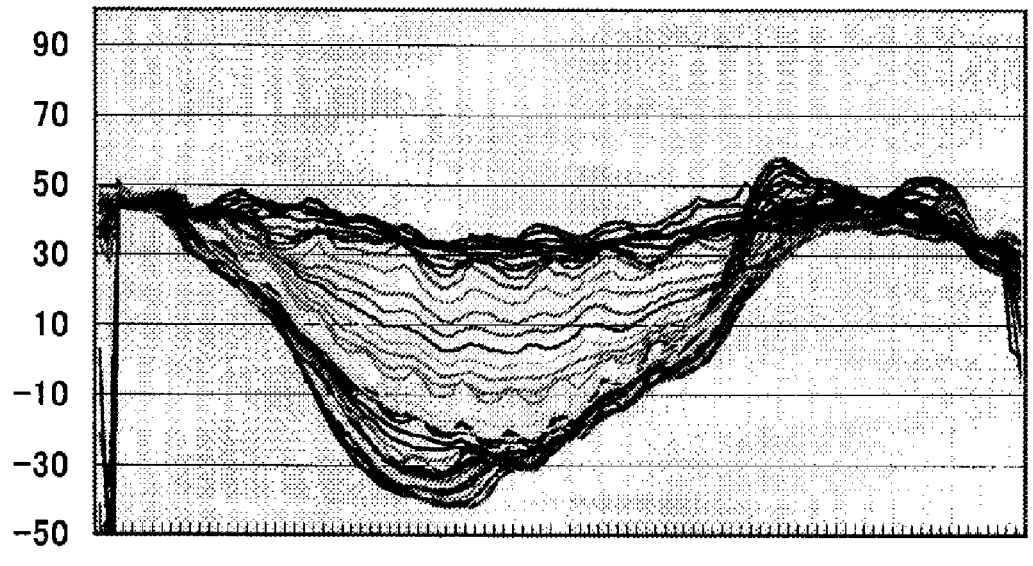
FIG. 10 is a graph showing the amount of swell in the Y direction in the wiring board shown in FIG. 8.

As show by a comparison of FIGS. 3 and 9, no large local swells (protrusions) are generated in the multilayer wiring board 11, unlike in the conventional wiring board 51.

The four land pieces 13a that are to be electrically connected via an external terminal 1a of the crystal oscillator 1 have an area no more than about half of the projected area of the external terminal 1a on the mounting surface 11a of the board body. In the first preferred embodiment, the area is set to about ¼ or less. Therefore, the area of the land pieces 13a is not unnecessarily large and has an appropriate area.

Of the areas of the land pieces 13a and the mounting lands 12 and 14, except for the mounting lands 13 defined by a plurality of land pieces 13a, the largest area A is that of the land pieces 13a, and the smallest area a is that of the mounting lands 12. The area ratio A/a therebetween is preferably about 3 or less. In this case, the area of the land pieces 13a and the areas of the mounting lands 12 and 14 are prevented from differing substantially. The amount of the swell (the amount of the protrusion) on the mounting surface due to the difference in shrinkage factor between the multilayer wiring board 11 and the mounting lands 12 to 14 is evened out, and the difference in height between the mounting lands is further reduced.

Second Preferred Embodiment

Figure 5:
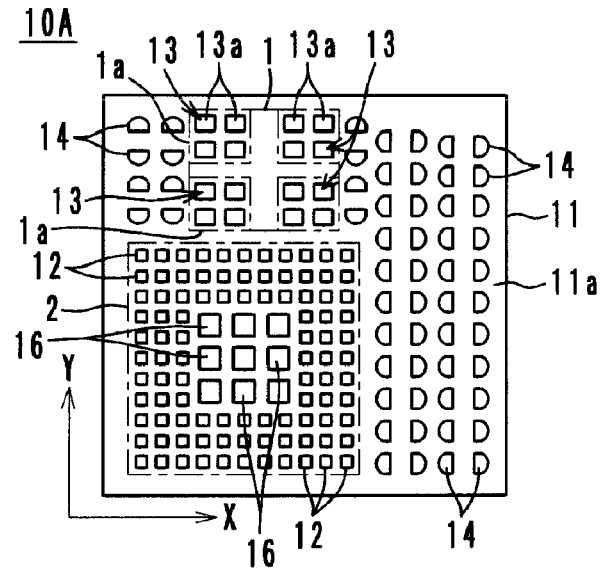
FIG. 5 is a plan view showing a second preferred embodiment of the wiring board and the wiring board module according to the present invention.

In the wiring board module 10A of a second preferred embodiment, as shown in FIG. 5, the multilayer wiring board 11 includes a swell correcting pattern 16 provided in an empty region in the portion where the IC component 2 is to be mounted (a region in which no mounting lands 12 are provided and which is surrounded by the mounting lands 12). The swell correcting pattern 16 is not a single large-area pattern but a plurality of relatively small-area patterns disposed close to each other.

As described above, generally, during firing, a board body made of ceramic shrinks, while mounting lands do not substantially shrink. Thus, the portions where the mounting lands are disposed on the mounting surface swell. Therefore, the portion at which no mounting lands 12 are disposed is relatively depressed. The swell correcting pattern 16 is therefore provided in the region on the surface of the multilayer wiring board 11 where no mounting lands 12 are provided. By intentionally generating swells (protrusions) with the swell correcting pattern 16 so that the amount of swell is the same as that in the region where the mounting lands 12 are formed, the flatness of the mounting surface is improved.

Figure 6:
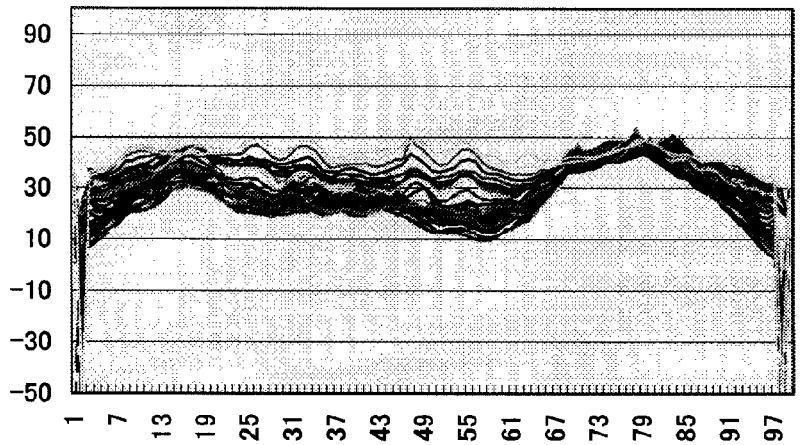
FIG. 6 is a graph showing the amount of swell in the X direction in the wiring board shown in FIG. 5.
Figure 7:
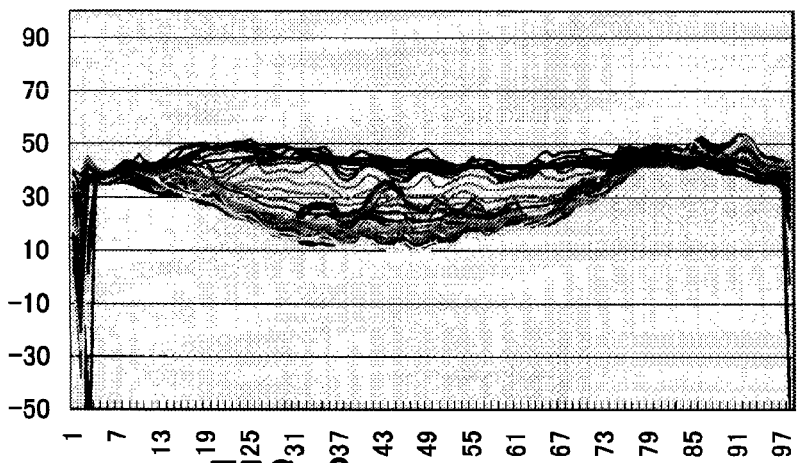
FIG. 7 is a graph showing the amount of swell in the Y direction in the wiring board shown in FIG. 5.

FIG. 6 is a graph showing the amount of swell in the X direction in the multilayer wiring board 11 shown in FIG. 5, measured throughout the multilayer wiring board 11 at predetermined pitch intervals. FIG. 7 is a graph showing the amount of swell in the Y direction in the multilayer wiring board 11, measured throughout the multilayer wiring board 11 at predetermined pitch intervals. In FIGS. 6 and 7, the vertical axis indicates the amount of swell (μm), and the horizontal axis indicates the positions of measuring points.

FIGS. 6 and 7 show that the multilayer wiring board 11 of the second preferred embodiment has less swell as compared to the first preferred embodiment.

The present invention is not limited to the above-described preferred embodiments, and various changes may be made without departing from the scope of the invention. The wiring board is not limited to a multilayer board, and instead, may be a single ceramic board.

As described above, the present invention is useful for high-frequency modules on which electronic components, such as an IC, are mounted, and is particularly outstanding in terms of reduction in swell of the substrate body.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A wiring board comprising:
    a board body on which components are to be mounted; and
    a plurality of mounting lands provided on the board body; wherein
    at least one of the mounting lands is defined by a plurality of adjacent land pieces that are to be electrically connected via a terminal of one of the components to be mounted and that are to thereby function as a mounting land for the terminal; and
    a swell correcting pattern is provided in a region on a surface of the board body where no mounting lands are provided and is arranged to intentionally generate swells such that an amount of swell in the region in which no mounting lands are provided is substantially the same as that in a region in which the mounting lands are provided.

2. The wiring board according to claim 1, wherein at least one of the plurality of land pieces that are to be electrically connected via a terminal of one of the components to be mounted has an area no more than about half of a projected area of the terminal on the mounting surface of the board body.

3. The wiring board according to claim 1, wherein each one of the plurality of land pieces that are to be electrically connected via a terminal of one of the components to be mounted has an area no more than about half of the projected area of the terminal on the mounting surface of the board body.

4. The wiring board according to claim 1, wherein an area ratio A/a between a largest area A and a smallest area a of the areas of the land pieces and the mounting lands except for the mounting lands composed of a plurality of land pieces, is about 3 or less.

5. The wiring board according to claim 1, wherein the board body is made of ceramic.

6. The wiring board according to claim 1, wherein the board body has a multilayer structure in which a plurality of ceramic layers and a plurality of internal electrodes are laminated.

7. A wiring board module comprising:
    the wiring board according to claim 1; and
    a component mounted on the wiring board arranged such that a terminal of the component electrically connects the plurality of land pieces.

8. A wiring board comprising:
    a board body on which components are to be mounted; and
    a plurality of mounting lands provided on the board body at locations corresponding to terminals of the components to be mounted; wherein
    at least one of the mounting lands is divided into a plurality of land pieces; and
    a swell correcting pattern is provided in a region on a surface of the board body where no mounting lands are provided and is arranged to intentionally generate swells such that an amount of swell in the region in which no mounting lands are provided is substantially the same as that in a region in which the mounting lands are provided.

9. The wiring board according to claim 8, wherein at least one of the plurality of land pieces that are to be electrically connected via a terminal of one of the components to be mounted has an area no more than about half of a projected area of the terminal on the mounting surface of the board body.

10. The wiring board according to claim 8, wherein each one of the plurality of land pieces that are to be electrically connected via a terminal of one of the components to be mounted has an area no more than about half of the projected area of the terminal on the mounting surface of the board body.

11. The wiring board according to claim 8, wherein an area ratio A/a between a largest area A and a smallest area a of the areas of the land pieces and the mounting lands except for the mounting lands composed of a plurality of land pieces, is about 3 or less.

12. The wiring board according to claim 8, wherein the board body is made of ceramic.

13. The wiring board according to claim 8, wherein the board body has a multilayer structure in which a plurality of ceramic layers and a plurality of internal electrodes are laminated.

14. A wiring board module comprising:
    the wiring board according to claim 8; and
    a component mounted on the wiring board arranged such that a terminal of the component electrically connects the plurality of land pieces.

15. A wiring board comprising:
    a board body on which components are to be mounted; and
    a plurality of mounting lands provided on the board body; wherein
    at least one of the mounting lands is defined by a plurality of adjacent land pieces that are to be electrically connected via a terminal of one of the components to be mounted and that are to thereby function as a mounting land for the terminal;
    at least another one of the mounting lands is defined by a single land;
    an area ratio A/a between a largest area A of areas of the land pieces of the at least one of the mounting lands and a smallest area a of the single land of the at least another one of the mounting lands is about 3 or less; and
    a swell correcting pattern is provided in a region on the surface of the board body where no mounting lands are provided.

16. The wiring board according to claim 15, wherein at least one of the plurality of land pieces that are to be electrically connected via a terminal of one of the components to be mounted has an area no more than about half of a projected area of the terminal on the mounting surface of the board body.

17. The wiring board according to claim 15, wherein each one of the plurality of land pieces that are to be electrically connected via a terminal of one of the components to be mounted has an area no more than about half of the projected area of the terminal on the mounting surface of the board body.

18. The wiring board according to claim 15, wherein the board body is made of ceramic.

19. The wiring board according to claim 15, wherein the board body has a multilayer structure in which a plurality of ceramic layers and a plurality of internal electrodes are laminated.

20. A wiring board module comprising:
the wiring board according to claim 15; and
a component mounted on the wiring board arranged such that a terminal of the component electrically connects the plurality of land pieces.

21. A wiring board comprising:
a board body on which components are to be mounted; and
a plurality of mounting lands provided on the board body at locations corresponding to terminals of the components to be mounted; wherein
at least one of the mounting lands is divided into a plurality of land pieces; and
at least another one of the mounting lands is defined by a single land;
an area ratio A/a between a largest area A of areas of the land pieces of the at least one of the mounting lands and a smallest area a of the single land of the at least another one of the mounting lands is about 3 or less; and
a swell correcting pattern is provided in a region on the surface of the board body where no mounting lands are provided.

22. The wiring board according to claim 21, wherein at least one of the plurality of land pieces that are to be electrically connected via a terminal of one of the components to be mounted has an area no more than about half of a projected area of the terminal on the mounting surface of the board body.

23. The wiring board according to claim 21, wherein each one of the plurality of land pieces that are to be electrically connected via a terminal of one of the components to be mounted has an area no more than about half of the projected area of the terminal on the mounting surface of the board body.

24. The wiring board according to claim 21, wherein the board body is made of ceramic.

25. The wiring board according to claim 21, wherein the board body has a multilayer structure in which a plurality of ceramic layers and a plurality of internal electrodes are laminated.

26. A wiring board module comprising:
the wiring board according to claim 21; and
a component mounted on the wiring board arranged such that a terminal of the component electrically connects the plurality of land pieces.

* * * * *